(12) United States Patent
Sun et al.

(10) Patent No.: US 11,573,354 B2
(45) Date of Patent: Feb. 7, 2023

(54) LIQUID CRYSTAL DISPLAY MODULE BACKLIGHT STRUCTURE, LIQUID CRYSTAL DISPLAY, AND DISPLAY DEVICE, WITH EACH INCLUDING A MATT LAYER

(71) Applicants: Beijing BOE Optoelectronics Technology Co., Ltd., Beijing (CN); BOE Technology Group Co., Ltd., Beijing (CN)

(72) Inventors: Xingpan Sun, Beijing (CN); Jiaqiang Wang, Beijing (CN); Sa Li, Beijing (CN); Zheng Zong, Beijing (CN); Qi Jing, Beijing (CN); Wenli Lan, Beijing (CN); Fuan Zhu, Beijing (CN); Zhenhua Luo, Beijing (CN); Jiaqi Zhang, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/469,681

(22) Filed: Sep. 8, 2021

(65) Prior Publication Data
US 2022/0137282 A1 May 5, 2022

(30) Foreign Application Priority Data
Nov. 5, 2020 (CN) .......................... 202022539993.3

(51) Int. Cl.
*G02B 5/00* (2006.01)
*F21V 8/00* (2006.01)
*G02B 1/04* (2006.01)
*G02F 1/1335* (2006.01)
*G02F 1/1345* (2006.01)

(52) U.S. Cl.
CPC ............... *G02B 5/003* (2013.01); *G02B 1/04* (2013.01); *G02B 6/0051* (2013.01); *G02B 6/0065* (2013.01); *G02B 6/0068* (2013.01); *G02B 6/0083* (2013.01); *G02F 1/13452* (2013.01); *G02F 1/133512* (2013.01); *H05K 2201/05* (2013.01)

(58) Field of Classification Search
CPC ............... G02B 6/0083; G02B 6/0086; G02F 1/133512; H05K 2201/05
USPC .......................................................... 349/58
See application file for complete search history.

(56) References Cited

U.S. PATENT DOCUMENTS

| | | | | |
|---|---|---|---|---|
| 10,216,038 B2* | 2/2019 | Liu | ................... | G02F 1/133308 |
| 2006/0125981 A1* | 6/2006 | Okuda | .............. | G02F 1/133308 |
| | | | | 349/110 |
| 2009/0251632 A1* | 10/2009 | Kim | ................... | G02F 1/133308 |
| | | | | 349/58 |

(Continued)

*Primary Examiner* — Keith G. Delahoussaye
(74) *Attorney, Agent, or Firm* — IPro, PLLC

(57) ABSTRACT

The disclosure relates to the technical field of liquid crystal display, and discloses a liquid crystal display module backlight structure which includes a light blocking tape, a FPC strip, rubber-iron layer, a reflective sheet, a light enhancement prismatic lens, a light guide plate, and a matt film layer, a first end of the matt film layer overlaps the FPC light strip and a second end overlaps the light enhancement prismatic lens; the first end is bonded to the light blocking tape and the second end is positioned between the light enhancement prismatic lens and the light guide plate.

15 Claims, 1 Drawing Sheet

(56) References Cited

U.S. PATENT DOCUMENTS

| | | | |
|---|---|---|---|
| 2010/0060816 A1* | 3/2010 | Fukai | G02F 1/133615 |
| | | | 349/110 |
| 2013/0021727 A1* | 1/2013 | Lo | H04N 13/31 |
| | | | 361/679.01 |
| 2015/0185409 A1* | 7/2015 | Kim | G02B 6/0088 |
| | | | 362/606 |
| 2017/0108721 A1* | 4/2017 | Bae | H01L 33/62 |

* cited by examiner

--Prior Art--

LIQUID CRYSTAL DISPLAY MODULE BACKLIGHT STRUCTURE, LIQUID CRYSTAL DISPLAY, AND DISPLAY DEVICE, WITH EACH INCLUDING A MATT LAYER

CROSS-REFERENCE TO RELATED APPLICATION

This application is based on and claims priority under 35 U.S.C 119 to Chinese Patent Application No. 202022539993.3, filed on Nov. 5, 2020, in the China National Intellectual Property Administration. The entire disclosure of the above application is incorporated herein by reference.

FIELD

The disclosure relates to the technical field of liquid crystal display, and more particularly relates to a liquid crystal display module backlight structure, a liquid crystal display, and a display device.

BACKGROUND

With the development of science and technology, the application of liquid crystal display is more and more common, and the liquid crystal display module backlight structure is an indispensable structure.

SUMMARY

The present disclosure provides a liquid crystal display module backlight structure including a light blocking tape, a Flexible Printed Circuit, light strip, rubber-iron layer, a reflective sheet, a light enhancement prismatic lens, a light guide plate, and a matt film layer, a first end of the matt film layer overlaps the FPC light strip and a second end overlaps the light enhancement prismatic lens; wherein the first end is bonded to the light blocking tape and the second end is positioned between the light enhancement prismatic lens and the light guide plate.

Alternatively, the matt film layer includes a light blocking Polyethylene terephthalate, PET film and a diffusion sheet; the light blocking PET film is located on a side, facing away from the light guide plate, of the diffusion sheet; the light blocking PET film includes a first portion, a second portion, and an intermediate portion; and the first portion overlaps the FPC light strip, the second portion overlaps the light enhancement prismatic lens, and the first portion is connected with the second portion via the intermediate portion.

Alternatively, the first portion of the light blocking PET film is bonded to the light blocking tape; and the second portion of the light blocking PET film is bonded to the diffusion sheet.

Alternatively, the second portion of the light blocking PET film is bonded to the diffusion sheet by single sided tape glue.

Alternatively, a thickness of the light blocking PET film is in a range of 0.02-0.05 T.

A liquid crystal display includes any one of the liquid crystal display module backlight structures described above.

A display device includes the liquid crystal display described above.

DETAILED DESCRIPTION OF THE EMBODIMENTS

Figure 1:
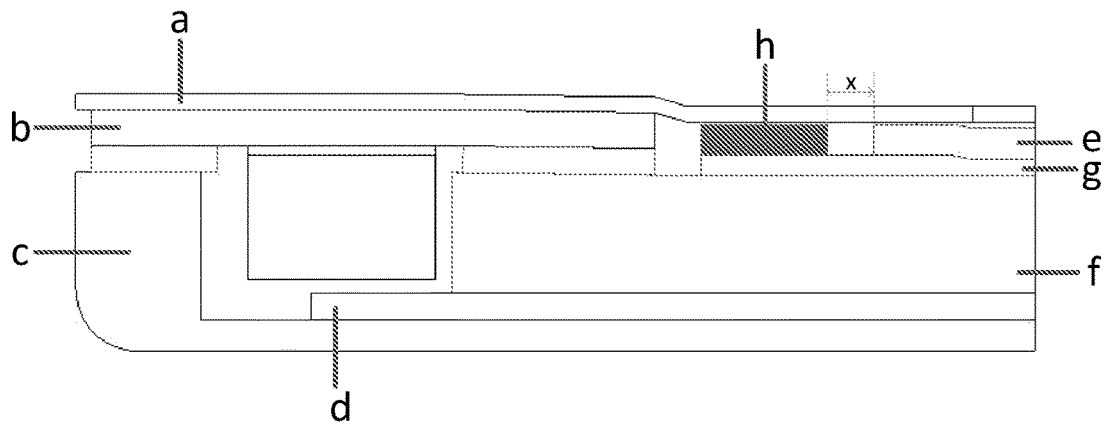
FIG. 1 is a schematic diagram illustrating a liquid crystal display module backlight structure in the related art.

FIG. 1 is a schematic diagram illustrating a liquid crystal display module backlight structure in the prior art, as shown in FIG. 1, the liquid crystal display module backlight structure in the related art includes a light blocking tape a, a FPC (Flexible Printed Circuit) light strip b, a rubber-iron layer c, a reflective sheet d, a light enhancement prismatic lens e, a light guide plate f, a diffusion sheet g, and a light blocking PET (Polyethylene terephthalate) film h; the light blocking PET film h functions to reduce incidence of light emitted from the light guide plate f into the side section of the light enhancement prismatic lens e, and is usually arranged in the same layer as the light enhancement prismatic lens e, and for the smooth assembly, a gap x is kept between the light blocking PET film h and the light enhancement prismatic lens e arranged in the same layer, which naturally increases the frame size of the border of the liquid crystal display module backlight structure.

The technical solution of embodiments of the disclosure will now be clearly and fully described in conjunction with the accompanying drawings of the embodiments of the disclosure, and it will be apparent that embodiments described are only some, but not all, embodiments of the disclosure. Based on embodiments in the present disclosure, all other embodiments obtained by those skilled in the art without creative effort fall within the scope of protection of the present disclosure.

Figure 2:
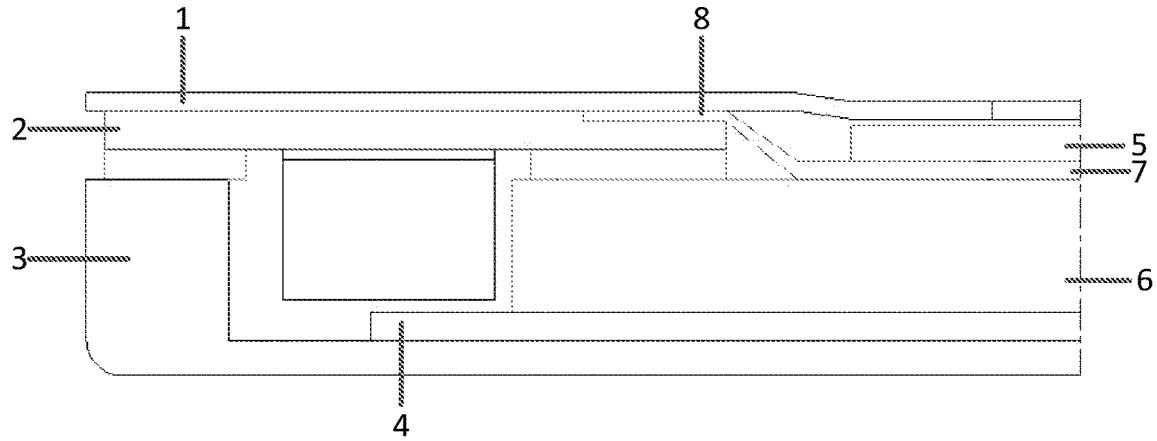
FIG. 2 is a schematic diagram illustrating a liquid crystal display module backlight structure in an embodiment of the present disclosure.

FIG. 2 is a schematic diagram illustrating a liquid crystal display module backlight structure in accordance with an embodiment of the present disclosure, as shown in FIG. 2, the liquid crystal display module backlight structure provided by an embodiment of the disclosure includes a light blocking tape 1, a FPC light strip 2, rubber-iron layer 3, a reflective sheet 4, a light enhancement prismatic lens 5, a light guide plate 6, and a matt film layer 7, wherein a first end of the matt film layer 7 overlaps the FPC light strip 2 and a second end overlaps the light enhancement prismatic lens 5; wherein the first end is bonded to the light blocking tape 1 and the second end is positioned between the light enhancement prismatic lens 5 and the light guide plate 6.

For the liquid crystal display module backlight structure provided by some embodiments, because the first end of the matt film layer 7 overlaps the FPC light strip 2 and the second end overlaps the light enhancement prismatic lens 5, incidence of light emitted from the light guide plate 6 into the side section of the light enhancement prismatic lens 5 is reduced. There is no need to arrange a light blocking PET film 9 and the light enhancement prismatic lens 5 in the same layer, and there is no gap between the light blocking PET film 9 and the light enhancement prismatic lens 5 arranged in the same layer.

Therefore, this arrangement can reduce the frame size of the liquid crystal display module backlight structure.

Referring to FIG. 2, as an alternative embodiment, the matt film layer 7 is a diffusion sheet 8.

In some embodiments, when the matt film layer 7 is a diffusion sheet 8, light passing through the diffusion sheet 8 can be diffused due to the characteristics of the diffusion sheet 8 itself, thereby effectively reducing light entering the side section of the light enhancement prismatic lens 5.

Figure 3:
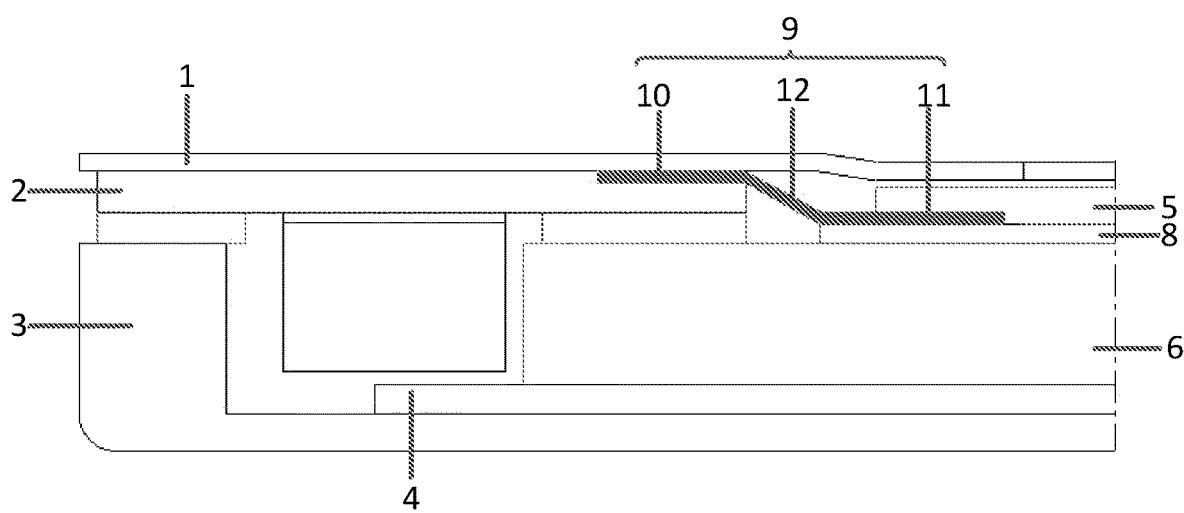
FIG. 3 is a schematic diagram illustrating a liquid crystal display module backlight structure in another embodiment of the present disclosure.

FIG. 3 is a schematic diagram illustrating a liquid crystal display module backlight structure in another embodiment of the present disclosure, as shown in FIG. 3, as an alternative embodiment, the matt film layer 7 includes a light blocking PET film 9 and a diffusion sheet 8; the light blocking PET film 9 is located on a side, facing away from the light guide plate 6, of the diffusion sheet 8; the light blocking PET film 9 includes a first portion 10, a second portion 11, and an intermediate portion 12; and the first portion 10 overlaps the FPC light strip 2, the second portion 11 overlaps the light enhancement prismatic lens 5, and the first portion 10 is connected with the second portion 11 via the intermediate portion 12.

In some embodiments, since the first portion 10 of the light blocking PET film 9 overlaps the FPC light strip 2, the second portion 11 of the light blocking PET film 9 overlaps with the light enhancement prismatic lens 5, and the intermediate portion 12 of the light blocking PET film 9 connects the first portion 10 and the second portion 11, the light blocking PET film 9 is capable of blocking light emitted from the light guide plate 6, thus effectively preventing light from entering the side section of the light enhancement prismatic lens 5, and further securing the display effect of the liquid crystal display module.

As an alternative embodiment, the first portion 10 of the light blocking PET film 9 is bonded to the light blocking tape 1; and the second portion 11 of the light blocking PET film 9 is bonded to the diffusion sheet 8.

In some embodiments, the bonding way can allow the light blocking PET film 9 to be mounted more stably, thus further improving the overall stability of the liquid crystal display module.

As an alternative embodiment, the second portion 11 of the light blocking PET film 9 is bonded to the diffusion sheet 8 by single sided tape.

In this embodiment, the single-sided tape is easy to obtain, convenient to use, and low in cost, and has a good bonding effect.

As an alternative embodiment, the thickness of the light blocking PET film 9 is in the range of 0.02-0.05 T (THICKNESS).

In some embodiments, taking into account the occupied gap, the cutting process, and other factors, the thickness of the light blocking PET film 9 should not be too large, and may be, for example, 0.03 T, depending on actual operating conditions, and is not specifically limited.

An embodiment of the present disclosure also provides a liquid crystal display including any one of the liquid crystal display module backlight structures described above.

In some embodiments, the benefits of the liquid crystal display are the same as those of any one of the liquid crystal display module backlight structures described above and will not be described again.

An embodiment of the disclosure also provides a display device including the liquid crystal display described above.

In this embodiment, the benefits of the display device are the same as those of the liquid crystal display described above and will not be described again.

It will be apparent to those skilled in the art that various modifications and variations can be made to the present application without departing from the spirit and scope of the application. Thus, it is intended that the present application include such modifications and variations insofar as they come within the scope of the appended claims and their equivalents.

What is claimed is:

1. A liquid crystal display module backlight structure, comprising a light blocking tape, a Flexible Printed Circuit (FPC) light strip, a rubber-iron layer, a reflective sheet, a light enhancement prismatic lens, a light guide plate, and a matt film layer, wherein a first end of the matt film layer overlaps the FPC light strip and a second end overlaps the light enhancement prismatic lens; wherein,
the first end is bonded to the light blocking tape and the second end is between the light enhancement prismatic lens and the light guide plate.

2. The liquid crystal display module backlight structure according to claim 1, wherein the matt film layer is a diffusion sheet.

3. The liquid crystal display module backlight structure according to claim 1, wherein the matt film layer comprises a light blocking Polyethylene terephthalate, PET film and a diffusion sheet;
the light blocking PET film is located on a side, facing away from the light guide plate, of the diffusion sheet;
the light blocking PET film comprises a first portion, a second portion, and an intermediate portion; and
the first portion overlaps the FPC light strip, the second portion overlaps the light enhancement prismatic lens, and the first portion is connected with the second portion via the intermediate portion.

4. The liquid crystal display module backlight structure according to claim 3, wherein the first portion of the light blocking PET film is bonded to the light blocking tape; and
the second portion of the light blocking PET film is bonded to the diffusion sheet.

5. The liquid crystal display module backlight structure according to claim 4, wherein the second portion of the light blocking PET film is bonded to the diffusion sheet by single-sided tape.

6. A liquid crystal display, comprising a liquid crystal display module backlight structure, wherein the liquid crystal display module backlight structure comprises a light blocking tape, a Flexible Printed Circuit (FPC) light strip, a rubber-iron layer, a reflective sheet, a light enhancement prismatic lens, a light guide plate, and a matt film layer, wherein a first end of the matt film layer overlaps the FPC light strip and a second end overlaps the light enhancement prismatic lens; wherein,
the first end is bonded to the light blocking tape and the second end is between the light enhancement prismatic lens and the light guide plate.

7. The liquid crystal display according to claim 6, wherein the matt film layer is a diffusion sheet.

8. The liquid crystal display according to claim 6, wherein the matt film layer comprises a light blocking Polyethylene terephthalate, PET film and a diffusion sheet;
the light blocking PET film is located on a side, facing away from the light guide plate, of the diffusion sheet;
the light blocking PET film comprises a first portion, a second portion, and an intermediate portion; and
the first portion overlaps the FPC light strip, the second portion overlaps the light enhancement prismatic lens, and the first portion is connected with the second portion via the intermediate portion.

9. The liquid crystal display according to claim 8, wherein the first portion of the light blocking PET film is bonded to the light blocking tape; and
the second portion of the light blocking PET film is bonded to the diffusion sheet.

10. The liquid crystal display according to claim 9, wherein the second portion of the light blocking PET film is bonded to the diffusion sheet by single-sided tape.

11. A display device, comprising a liquid crystal display, wherein the liquid crystal display comprises a liquid crystal display module backlight structure, wherein the liquid crystal display module backlight structure comprises a light blocking tape, a Flexible Printed Circuit (FPC) light strip, a rubber-iron layer, a reflective sheet, a light enhancement prismatic lens, a light guide plate, and a matt film layer, wherein a first end of the matt film layer overlaps the FPC light strip and a second end overlaps the light enhancement prismatic lens; wherein, the first end is bonded to the light blocking tape and the second end is between the light enhancement prismatic lens and the light guide plate.

12. The display device according to claim 11, wherein the matt film layer is a diffusion sheet.

13. The display device according to claim 11, wherein the matt film layer comprises a light blocking Polyethylene terephthalate, PET film and a diffusion sheet;

the light blocking PET film is located on a side, facing away from the light guide plate, of the diffusion sheet;

the light blocking PET film comprises a first portion, a second portion, and an intermediate portion; and the first portion overlaps the FPC light strip, the second portion overlaps the light enhancement prismatic lens, and the first portion is connected with the second portion via the intermediate portion.

14. The display device according to claim 13, wherein the first portion of the light blocking PET film is bonded to the light blocking tape; and the second portion of the light blocking PET film is bonded to the diffusion sheet.

15. The display device according to claim 14, wherein the second portion of the light blocking PET film is bonded to the diffusion sheet by single-sided tape.

\* \* \* \* \*